United States Patent [19]

Wihl et al.

[11] Patent Number: 4,758,094
[45] Date of Patent: Jul. 19, 1988

[54] PROCESS AND APPARATUS FOR IN-SITU QUALIFICATION OF MASTER PATTERNS USED IN PATTERNING SYSTEMS

[75] Inventors: Tim S. Wihl, Tracy; Frank D. Yasher, San Jose, both of Calif.

[73] Assignee: KLA Instruments Corp., Santa Clara, Calif.

[21] Appl. No.: 50,994

[22] Filed: May 15, 1987

[51] Int. Cl.$^4$ .............................................. G01B 11/00
[52] U.S. Cl. .................................................... 356/394
[58] Field of Search ........................ 356/394, 398, 237; 358/101, 106; 355/53; 437/20, 229

[56] References Cited

U.S. PATENT DOCUMENTS

| | | | |
|---|---|---|---|
| 4,115,120 | 9/1978 | Dyer et al. | 437/229 |
| 4,349,880 | 9/1982 | Southgate et al. | 356/237 |
| 4,443,096 | 4/1984 | Johannsmeier et al. | 355/53 |
| 4,586,822 | 5/1986 | Taniimoto | 356/394 |
| 4,623,608 | 11/1986 | Andrevski | 355/43 |
| 4,633,504 | 12/1986 | Wihl | 356/237 |
| 4,641,353 | 2/1987 | Kobayashi | 358/101 |
| 4,648,053 | 3/1987 | Fridge | 358/101 |

OTHER PUBLICATIONS

KLA-210 Series High-Speed Automatic Photomask Inspection System, KLA Instruments Corporation, Data Sheet 1986.
KLA 2020 Wafer Inspector, KLA Instruments Corporation, Data Sheet, 1984.
Klaris Automatic Reticle Inspection System, KLA Instruments Corporation, Data Sheet (Undated).
Klaris Automatic Reticle and Photomask Inspection System, KLA Instruments Corporation Data Sheet, 1986.
ARQUS-20 Automatic Reticle Qualification System, Sony Corporation Data Sheet (Undated).
DSW Wafer Stepper Model 6200, GCA Corporation IC Systems Group Data Sheet, 12/82.
NSR-1505G2A Step-and-Repeat System, A fully automated high-resolution system for high-volume VLSI production of large-format wafers, Nikon Precision Inc. Data Sheet (Undated).
3WD36 Automatic Wafer Inspection System, NJS Corporation Data Sheet (Undated).
Opticle Microlithograph IV, Proceedings of SPIE Volume 538, 1985.
Die-to-Database Inspection—An Effective Method of Detecting and Locating Defects on Reticles, Eileen Jozefov et al., Solid State Technology, Jan. 1987, pp. 79–82.
Qualifying Reduction Reticles, Semiconductor International, Aug. 1984, pp. 68–73.
Photomask and Reticle Defect Detection, Semiconductor International, Apr. 1985, pp. 66–73.
7MD62-7MD63 Automatic Mask/Reticle Inspection System, NJS Corporation Data Sheet (Undated).

*Primary Examiner*—R. A. Rosenberger
*Attorney, Agent, or Firm*—Rosenblum, Parish & Bacigalupi

[57] ABSTRACT

A process and apparatus for qualifying a reticle, master pattern, or the like, in-situ as it is used in a system for photolithographically creating an image on a substrate, including the steps of coating a transparent substrate with a layer of transparent photoresist material, placing the coated substrate with a layer of transparent photoresist material, placing the coated substrate on a substrate supporting means, using a source of illumination in combination with a reticle, or master pattern, to create an image of the reticle, or master pattern, on the substrate, thereby exposing the photo resist coated on the surface thereof, removing the substrate from the supporting means, developing the exposed photoresist to produce a transparent patterned mask on the surface of the substrate, said patterned mask corresponding to the pattern on the reticle, or master pattern, and, in combination with the substrate, forming a monitor object, inspecting the monitor object by passing light through both the transparent masked and transparent unmasked areas of the substrate to detect defects, and using the detected defects as a measure of the quality of the reticle or master pattern.

51 Claims, 5 Drawing Sheets

PROCESS AND APPARATUS FOR IN-SITU QUALIFICATION OF MASTER PATTERNS USED IN PATTERNING SYSTEMS

BACKGROUND OF THE INVENTION

1. Field of the Invention

This invention relates to the qualification of master patterns as used in a patterning system, wherein the master pattern is qualified in-situ, and the detected defects are a measure of the quality of said master pattern. In particular, this invention relates to the qualification of a reticle used in the photolithographic patterning processes in the manufacture of integrated circuits, wherein the qualification method utilizes a resist coated quartz substrate and a transmitted light automatic inspection system.

2. Description of the Prior Art

Methods for the qualification of master patterns used in patterning systems have been in use for a number of years and have been described in the literature for some time. Furthermore, equipment and various objects designed or modified for use with these processes have also been commercially available.

There are three basic techniques that have been used: (1) carefully inspect the master pattern before it is installed in the patterning system, or provide a device which inspects it while it is in the patterning system, (2) pattern one or a small number of product objects and then inspect them carefully before subsequent product objects are patterned, or, (3) use a substitute object which is patterned and then is carefully inspected prior to patterning of product objects.

Referring to the first method described above, wherein the master pattern is inspected prior to use and certified to be defect free, it is possible that the master pattern may become contaminated or damaged while it is being moved from the inspection equipment to the patterning system and may receive further contamination or damage while it is being loaded in the patterning system. In addition, the master pattern may become contaminated while the patterning system is operating or it may become defective due to degradation of the pattern material through natural causes such as flaking or electrostatic damage. These problems will generally go undetected until the master pattern is unloaded and reinspected, this may allow significant product to be patterned with a defective master, thus reducing process yield. An improvement to this technique utilizes an inspection apparatus located in the patterning system.

In the case of wafer steppers used for photolithographic patterning of integrated circuits, a laser scanner has been available from one manufacturer as described in the data sheet from Nikon Precision, Inc., describing the model NSR-1505G2A "Step and Repeat System"; this device has been of limited usefulness since it responds only to particle type contamination which has sufficient height to scatter a laser beam, it has no capability to detect flaking of the pattern material, scratches, nor particles with low height but wide extent. In recent years, pellicles have been in use to cover the surfaces of the master pattern to further prevent contamination, although problems with contamination and ESD continue to be reported in the literature, refer to the article "Glass Wafer Processing and Inspection for Qualification of Reticles in a Fineline Wafer Stepper Production Facility" R. T. Hilton, T. E. Zavecs, J. A. Reynolds, *Proceedings Of SPIE—Optical Microlithography IV, SPIE* Volume 538, 1985.

Referring to the second technique described above, wherein one or a small number of product is patterned and then carefully inspected prior to patterning of additional product, this technique sacrifices one or several product objects which may have already received several process steps prior to this patterning and thus this technique may be very expensive. Furthermore, this patterning step may interact with one or more of the prior steps and cause an inspection of the present pattern to be very difficult. In the case of photolithographic patterning of integrated circuit wafers, there is equipment available which can inspect one of many layers present on a wafer, but the equipment is very slow and very expensive, refer to the data sheet from KLA Instruments describing the model KLA-2020 Wafer Inspector dated 1984. Oftentimes the master pattern is changed frequently requiring frequent qualification. Furthermore, in the patterning of integrated circuits, it has been observed that although a master pattern may stay in the patterning system for an extended period, it is necessary to frequently re-qualify it in order to detect contamination or pattern material damage that may have occurred since the last qualification. Since patterning of product wafers is generally halted until the qualification step has been completed, it is desirable to have a very fast qualification process.

The third technique described above uses a substitute object for qualification which closely resembles the product object. In this technique, prior to patterning of the product objects, the substitute or monitor object is patterned and then inspected. The selection of the monitor object is important to the qualification process, in that it should respond to the patterning process as closely to a product object as possible and yet is should be able to be inspected by available inspection equipment easily, quickly and with high quality. The degree to which these criterion are met determines the effectiveness of the qualification process.

For the qualification of photolithographic patterning equipment used in the manufacture of integrated circuits, a common technique has been to use inspection equipment designed for the automatic inspection of photomasks and reticles as described in the abovementioned article by R. T. Hilton et al. This equipment, as described in the data sheet from KLA Instruments describing the model KLA-229 "Automatic Reticle and Photomask Inspection System", has the advantage of being readily available, operates at high inspection speeds, and is of reasonable cost. Since this type of inspection machine is designed to inspect photomasks and reticles, the monitor object used for the qualification of the photolithographic system must have characteristics like a photomask or reticle before it can be inspected, i.e. a transparent glass or quartz substrate with a very opaque, very thin coating such as chrome which contains the pattern to be inspected. In addition, the monitor object must be able to be handled and patterned by the patterning system, thus requiring it to have the same physical dimensions, resist coating, and opacity to infra-red illumination as does a silicon wafer. The opacity to infra-red illumination is important since many photolithographic patterning systems use infra-red sensors to detect the presence, position and orientation of wafers as well as use infra-red illumination for autofocussing purposes.

This prior art technique, then, uses a transparent glass or quartz substrate of the same physical dimensions as a silicon wafer; the aforementioned substrate is then coated with a thin layer of chrome and then coated with the resist used by the patterning system—this is called a chrome glass wafer. The patterning system handles this monitor object just like a product wafer—the chrome coating provides sufficient infra-red opacity, the monitor is the same physical size for proper handling, and the resist coating responds to the master pattern for proper patterning. The patterned monitor is then developed, the chrome etched, and the resist stripped. The monitor object now has the target pattern from the patterning system contained in the chrome coating, it has the same optical characteristics as a photomask or reticle, and needs only a holder to adapt its physical size to the inspection system; these holders are readily available from most inspection equipment manufacturers including KLA Instruments.

This patterning qualification technique has been in use for a number of years and avoids all of the disadvantages mentioned earlier for the other two techniques. This technique, however, has the disadvantages that it requires a separate chrome etching step for which equipment is not available in a wafer fabrication area and must be purchased separately. Furthermore, great care must be exercised in the etching step to accurately etch the chrome to reproduce the resist pattern so as to yield an accurate representation of the master pattern. In addition, the chrome glass wafers are expensive and are not reuseable which further adds to the cost, and finally, chrome is a heavy metal which is known to contaminate silicon wafers and must be carefully handled—in particular, recent evidence has suggested that slight amounts of chrome are left deposited on the wafer track equipment and the chuck of the stepper insomuch that the chrome particles contaminate subsequent silicon wafers. Experimentation with other metal coatings such as aluminum and titanium have been reported. These coatings could avoid the contamination problem.

Another variant of the monitor object approach uses a normal blank silicon wafer (no prior processing) as the monitor substrate and coats it as normal with resist. This monitor wafer is then patterned, developed and inspected with a reflected light inspection system such has become available in recent years, and is described in the data sheet from Sony Corporation which describes the model ARQUS-20 "Automatic Reticle Qualification System", and in the data sheet from NJS Corporation describing the model 3WD36 "Automatic Wafer Inspection System". This prior art method has the advantage that there are no extra processing steps, no heavy metal contamination, and the monitor wafers are reuseable, however, the inspection equipment that has been available to date has been very slow and expensive and have yielded only marginal inspection performance. This is partly due to the low light levels and low contrast typical of reflected light imaging of resist coated silicon. A number of techniques have been used recently to improve the contrast of the resist coated areas of the pattern versus the non-resist coated areas such as using dyes in the resist or using spectral filters in the illumination of the inspection station. These techniques have yielded somewhat better results.

SUMMARY OF THE PRESENT INVENTION

It is therefore a principal object of the present invention to provide a novel method for the in-situ qualification of master patterns used in patterning systems, especially those used in the manufacture of integrated circuits.

It is another object of the present invention to provide a method of in-situ qualification of master patterns used in patterning systems which minimizes the number of process steps, provides a reuseable monitor object, does not contaminate the area with heavy metals, and provides a high speed, high quality, cost effective inspection.

It is another object of the present invention to provide a method of in-situ qualification of master patterns used in patterning systems by using a monitor object comprising a transparent substrate, or an infra-red absorbing transparent substrate, with a resist coating and, optionally, an opaque border and/or an infra-red reflective coating, together with an inspection system using transmitted light and an optical scanner/detector to provide a high quality, high speed inspection.

These and other objects, which will hereinafter become apparent, are accomplished in accordance with the illustrated preferred embodiment of the present invention by providing a monitor wafer which is comprised of a transparent glass substrate coated with resist in the approximate same thickness as used by the patterning system. The monitor wafer may optionally be fabricated of an infrared absorbing material, or have an opaque border and/or an infra-red reflective coating to facilitate handling and focussing in the patterning system. An automatic inspection system is then used to inspect the monitor wafer with transmitted light to provide a high quality, high speed inspection.

Some of the numerous advantages of the present invention are that it provides an efficient, high quality, high speed in-situ qualification of a master pattern as used in a patterning system, by making use of a reuseable substrate, minimizing process steps and using readily available high-speed automatic transmitted light inspection systems.

These and other objects and advantages of the present invention will no doubt become apparent to those skilled in the art after having read the following detailed description of the preferred embodiment which is illustrated in the several figures of the accompanying drawing.

DETAILED DESCRIPTION OF THE PREFERRED EMBODIMENTS

Figure 1:
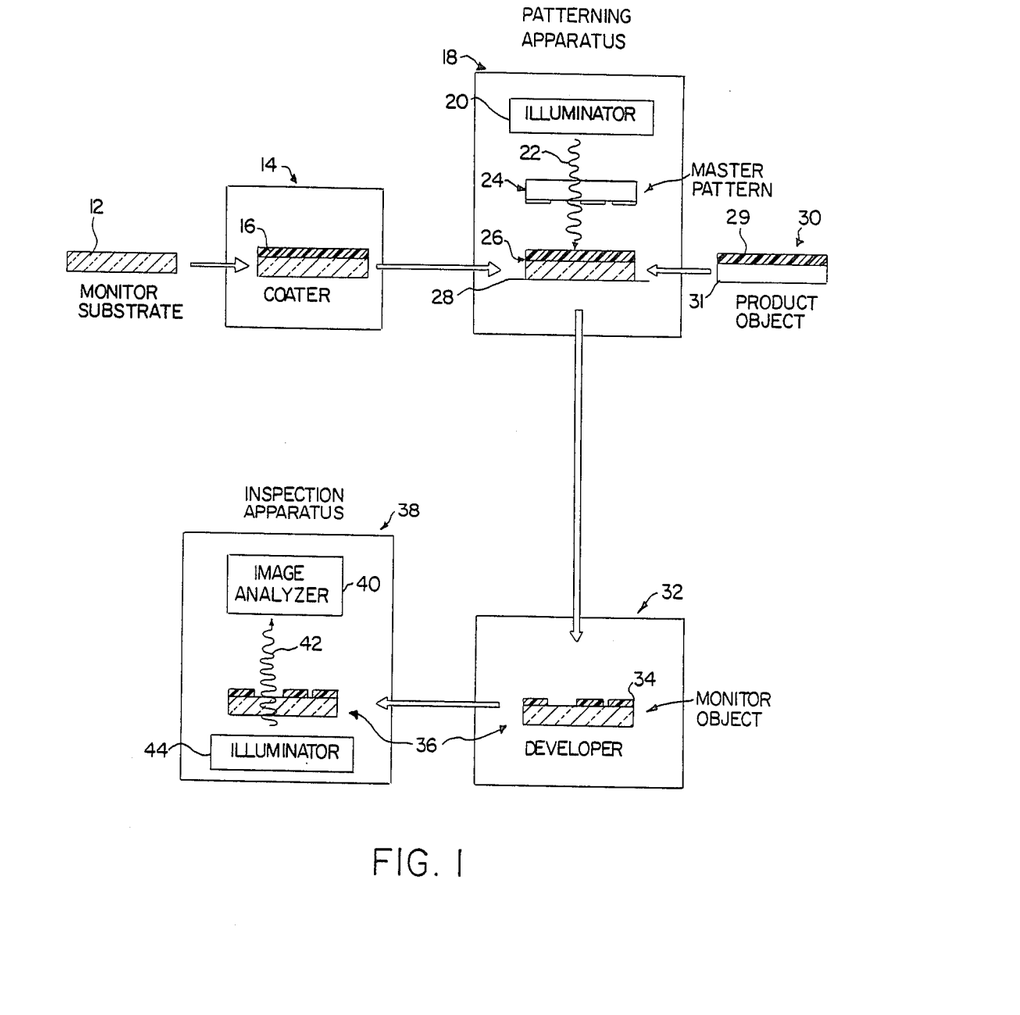
FIG. 1 is a functional block diagram illustrating an in-situ qualification method of a master pattern used in a patterning system according to the present invention.

Referring now to FIG. 1 of the drawing, the preferred embodiment of an in-situ qualification method of a master pattern as used in a patterning system according to the present invention is shown diagrammatically. The monitor substrate 12, which is generally transparent as will be described in more detail below, is first coated with generally transparent photoresist material 16 by the coater 14. The coated substrate 26 is then placed in the patterning apparatus 18 on the substrate supporting means 28. Illumination 22 is passed through the master pattern 24 from the illuminator 20 such that the aforementioned photoresist material on the monitor substrate is exposed according to the pattern on the aforementioned master pattern. The exposed resist coated monitor substrate 26 is then removed from the supporting means and developed by the developer 32. A transparent patterned mask is thus produced on the surface of the monitor substrate thereby forming the monitor object 36.

The monitor object 36 is inspected by the inspection apparatus 38 by passing light 42 from the illuminator 44 through the transparent masked and unmasked areas of the monitor object 36 to the image analyzer 40 for the detection of defects. The defects detected by the image analyzer are a measure of the quality of the aforementioned master pattern.

Since the monitor object 36 is inspected with transmitted light by the inspection apparatus 38, the monitor object 36 must be sufficiently transparent (in the unmasked areas) to the wavelengths of light used by said inspection apparatus such that there is sufficient brightness for proper operation of the image analyzer 40. Furthermore, the masked areas of the monitor object 36 must also be sufficiently transparent such that the image analyzer can produce and detect bands at the edges of the masked areas as will be described in more detail below.

A typical product object 30 is shown to indicate that it is also patterned by the patterning apparatus. As shown, the said product object 30 comprises a generally opaque substrate 31 which is coated with photoresist material 29 of the same variety coated on the aforementioned monitor substrate.

The image analyzer 40 can use a variety of methods to detect defects. In the case of wafer stepper type patterning systems, as used in the manufacture of integrated circuits, typically the master pattern, or reticle, contains more than one identical pattern or die. Accordingly, the monitor object 36 contains a pattern from each of the die. In this case the image analyzer can compare two substantially identical die on the same object to each other and locate differences therebetween. These differences are the result of defects in the master pattern. If there is only one die on the master pattern or reticle, then the resulting pattern developed on the monitor object can be evaluated based on a set of rules, such as pattern line spacings, or can be compared to a database representation of the pattern wherein differences are detected as defects. The database representation must be prepared so as to resemble the representation detected by the aforementioned image analyzer.

The patterning apparatus 18 may be of any type and need not use visible light as the illumination. The only requirement is that the monitor object substrate be coated with a photoresist material which can be exposed by the patterning apparatus illumination and then be developed in order to produce a patterned mask 34 on the surface of monitor substrate which represents the pattern on the master pattern, and which can be inspected by the transmitted light inspection apparatus in the manner described. In general, the photoresist material coated on the monitor substrate is of the same type as used on the product object 30.

Referring now to FIG. 2, shown here are several variations of the photoresist coated monitor substrate 26 which can be used for in-situ qualification of reticles used in wafer steppers or other patterning systems used for the manufacture of integrated circuits. The monitor wafer shown in FIG. 2A is the basic version and consists of a glass or quartz substrate 12 which is the same diameter and thickness and has the same edge flat, F, as the silicon wafer for which it is being substituted. It is coated with photoresist 16 which is typically the same resist and about the same thickness as used for the silicon wafers. This photoresist is generally transparent to visible light. The resist may be different than that used on the silicon wafers. However, it must be of sufficient thickness and transparency to produce dark bands of its edges, as will be explained in more detail below. FIG. 2B shows a cross-section of the coated monitor substrate 26 at cut-line 2B. This cross-section shows the generally transparent substrate 12 and the generally transparent photoresist coating 16.

Figure 2A:
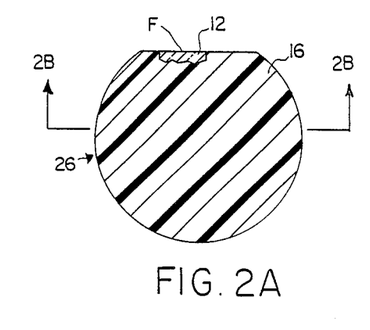
FIGS. 2A-2F are diagrams showing the shape of the monitor wafer and the different types of coatings that may be applied to it as used in qualifying photolithographic patterning systems.
Figure 2B:
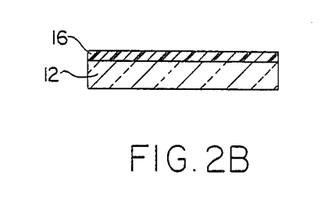
Figure 2C:
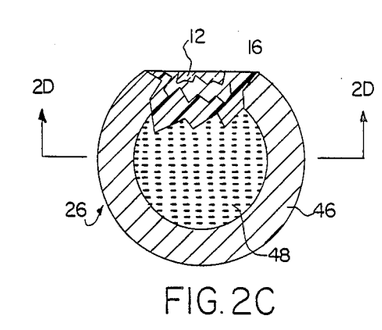
Figure 2D:
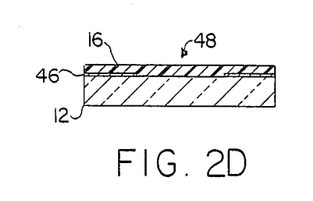

It is often the case that equipment which automatically handles silicon wafers uses infra-red detectors to locate the position and orientation of each wafer. In these cases, the substrate 12 must be conditioned to properly block the detectors. One possible method is to fabricate the substrate 12 out of an infra-red absorbing material which is generally transparent to the visible light wavelengths used by the inspection apparatus. Another alternative is shown in FIG. 2C, wherein a substrate with an opaque border 46 is used. The opaque border might be deposited chrome or other metal, or some other technique may be used, insomuch that opaque border is opaque to infra-red wavelengths and the visible wavelengths used by the inspection apparatus. The open area 48 is provided for the patterned mask 34 wherein the inspection station illumination can properly pass through the substrate. The substrate 12 with the opaque border 46 is coated with photoresist material 16 as described previously. FIG. 2D shows a cross-section of the coated substrate 26 at the cut-line 2D wherein the substrate 12, the opaque border 46, the photoresist material 16, and the open area 48 are all shown.

Figure 2E:
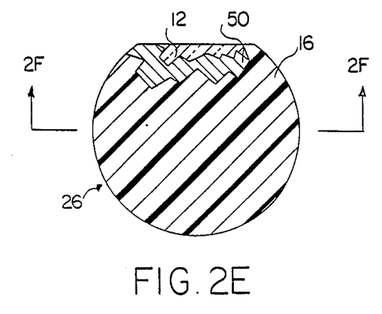
Figure 2F:
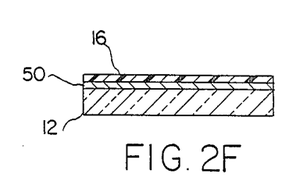

In some of the aforementioned patterning systems used in the manufacture of integrated circuits, the image of the master pattern is focussed on the object to be patterned by using an infra-red focussing apparatus. In this case, the object to be patterned must be opaque to the infra-red light beams. FIG. 2E shows a photoresist coated monitor substrate 26 which has an infra-red reflective or absorptive coating 50 applied to the substrate 12 before the photoresist material 16 is applied.

Thus, the substrate will be opaque to the infra-red light beam used for automatic focussing.

The general principle is that the monitor substrate used must be absorptive to wavelengths used by the patterning system (or coater and developer, as well as any other equipment used in the method) for automatic handling and/or focussing, and the substrate must be generally transmissive to the wavelengths of the light used by the inspection system for illumination. Three methods have been described above which satisfy this principle in the case of typical patterning systems used in the manufacture of integrated circuits; it is also intended that any combinations of these methods could also be used.

FIG. 3 shows a cross-section of the monitor object 36 which contains a generally transparent mask 34 formed on the surface of the substrate 12. Light rays 52, 54, 56, and 58 from the inspection system illuminator 44 are shown. The illumination is of the brightfield type wherein the rays impinge the bottom surface of the substrate at a low angle of incidence. Light ray 52 passes through the generally transparent unmasked substrate with little transmission loss. Similarly, light ray 56 passes through the masked portion of the substrate, also with little loss in transmission due to the generally high transmissivity of the substrate 12 and the pattern mask 34. Thus, light rays 52 and 56 have very close to the same intensity, with the ray 56 passing through the photoresist pattern mask 34 being about 5% lower in brightness than the ray 52 passing through the substrate only. The photoresist pattern mask 34 has a thickness of typically 0.5-1.5 microns with an edge angle of about 80 degrees. Light rays which occur near the edge of the masked area are both reflected and refracted, as shown with light rays 54 and 58. The ray 58 is refracted at the edge boundary while ray 54 is diffracted. These two rays thus are not collected by the image analyzer and cause the brightness of the edge to be much lower than either rays 52 or 56.

Figure 3A:
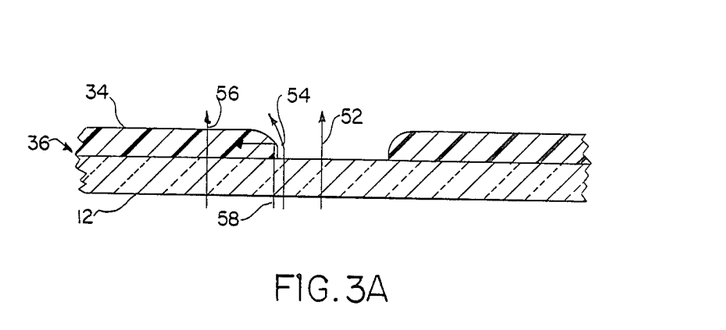
FIGS. 3A-3D are diagrams which show cross-sections of a monitor wafer after patterning, and the resulting light intensity profiles obtained using two types of optical scanner inspection systems.
Figure 3B:
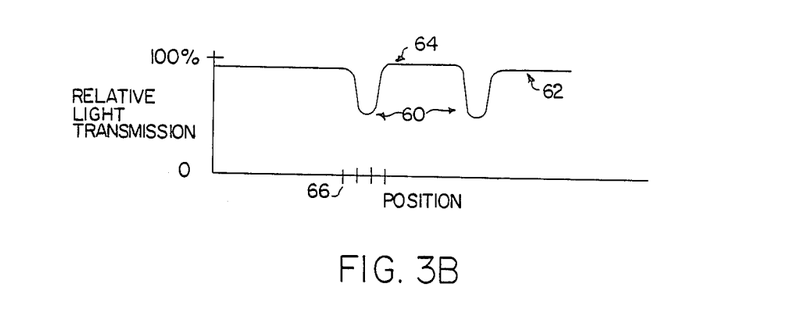

FIG. 3B shows the light intensity profile of the cross-section in FIG. 3A as described above. On the Y-axis, 100% brightness is equal to the light which passes through the substrate 12 as indicated by section 64 of the profile. Section 62 of the profile shows that the intensity through the photoresist pattern mask 34 is slightly less than that through the substrate only. Section 60 of the profile shows that the brightness at the edges of the photoresist pattern mask is roughly 50% of the brightness through the substrate only, thus producing a dark band. The actual brightness of the band is somewhat dependent on the numerical aperture of the illuminator 44 and the image analyzer 40, both of the inspection apparatus 38. A very low numerical aperture cannot resolve the dark bands due to their small size. Since the image analyzer 40 depends on a good signal from the edges for proper operation, the numerical apertures must be chosen accordingly, and the photoresist pattern mask thickness and edge angle must also be chosen properly. If the numerical apertures are too small, and/or if the resist thickness is too small, or the edge angle too large, then there might be an insufficient band from the edges of the pattern causing poor operation of the image analyzer and poor detection of defects in the monitor object. Furthermore, the image analyzer 40 must sample the intensity profile shown in FIG. 3B with pixel elements small enough to provide a reliable signal from the bands 60. The pixel size 66 shown is of an appropriate size to provide a good signal; that is, the pixel is about one-half of the half-width of the band 60. A pixel size approximately equal to or smaller than the width of the band will provide a good signal for the detection of defects by the image analyzer.

Figure 3C:
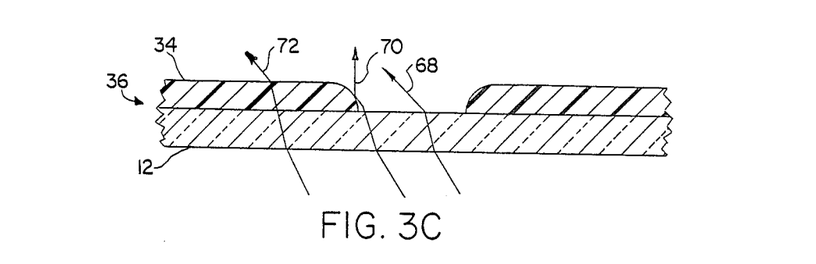
Figure 3D:
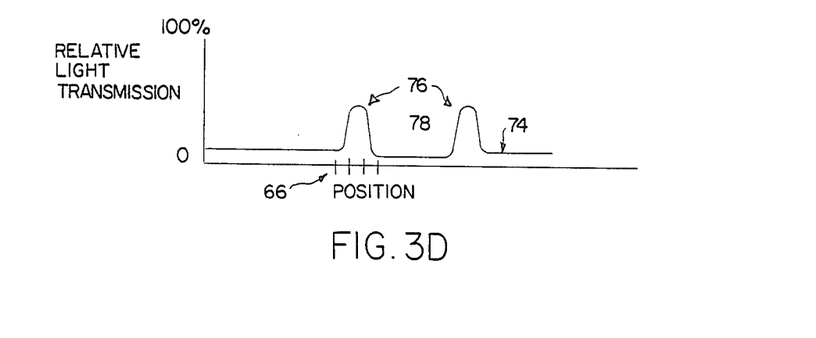

FIG. 3C shows a cross-section of a monitor object 36 when darkfield illumination is used by the illuminator 44. In this case, the light rays 68, 70, and 72 impinge upon the bottom surface of the substrate 12 at a high angle. Rays 68 and 72 are refracted and are not collected by the image analyzer 40. This results in areas of very low intensity as indicated by intensity profiles 78 and 74 respectively as shown in FIG. 3D. Light ray 70 is scattered by the edge of the photoresist pattern mask 34 and is collected by the image analyzer 40. This results in the bright intensity profiles 76, as shown in FIG. 3D. The pixel size 66 must be similarly sized as described previously.

Figures 4A, 4B:
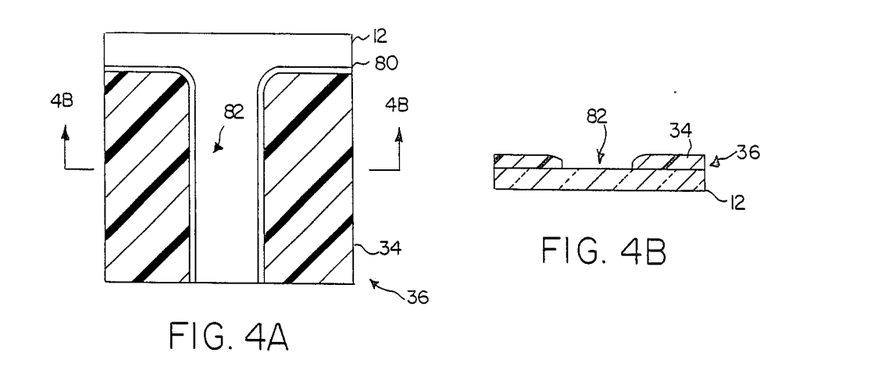
FIGS. 4A-4D are diagrams depicting top plan views and corresponding cross-sections of a typical pattern on a monitor wafer showing the dark bands and the appearance of a typical defect.
Figures 4C, 4D:
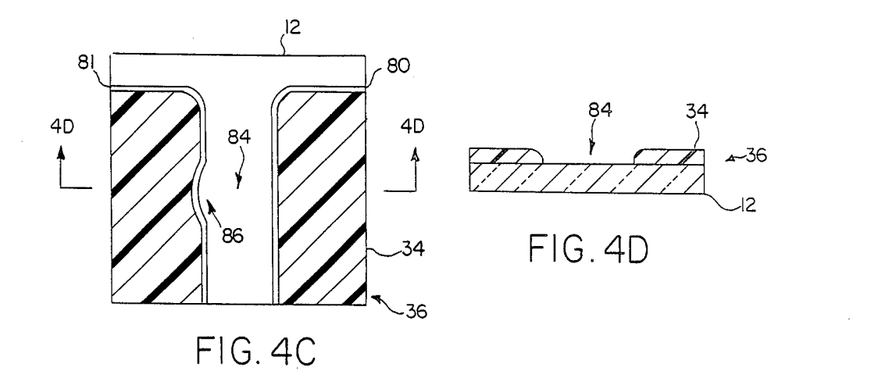

FIGS. 4A and 4C show plan views of a portion of the monitor object 36 as it might be viewed by the image analyzer 40. FIG. 4A shows a typical pattern consisting of the generally transparent substrate 12, generally transparent photoresist pattern mask 34, and dark bands 80 on the edges of the pattern mask. A cross section taken along cut-line 4B is shown as FIG. 4B. The unmasked area 82 is also shown. FIG. 4C shows a plan view of a portion of the monitor object 36 which contains an edge defect 86. As can be seen, the edge defect causes the dark band 81 to be displaced as a result of the resist edge being displaced from its nominal position. This resist edge displacement is shown in the cross section in FIG. 4D, which is taken along the cut-line 4D. Note that the width of the space at 84 is wider than the space at 82.

Figures 4E, 4F:
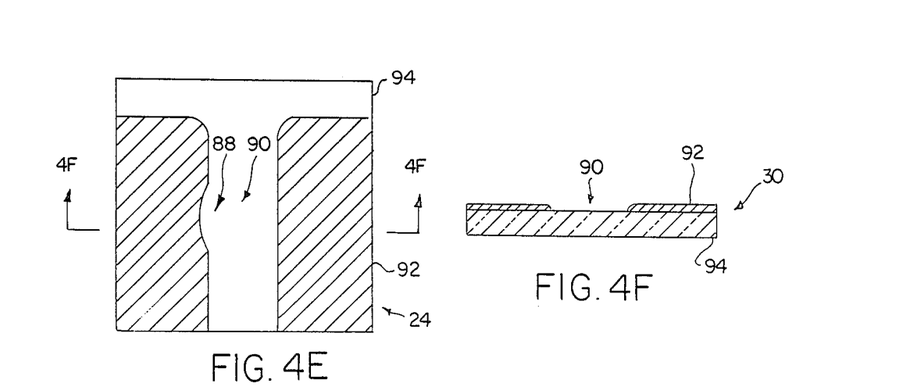
FIGS. 4E and 4F depict a top plan view and corresponding cross-section of a typical high contrast image such as might result from a chrome wafer or dyed resist image.

Shown in FIG. 4E is the defect 88 as it might appear on a master pattern 24, or reticle, which might be used in the manufacture of integrated circuits. A cross-section taken at cut-line 4F is shown in FIG. 4F. The open space 90 is of the approximate same width as the open space 84 in the pattern mask of the monitor object. Referring back to FIG. 4E, the transparent part of the master pattern 24 is shown as 94 and the opaque portion is shown as 92. For master patterns, or reticles, used in the manufacture of integrated circuits, the substrate 94 is typically glass or quartz, and the opaque coating 92 is typically a very thin coating of chrome. When illuminated, this results in an image having high contrast between the clear and opaque regions and no dark band on the pattern edges.

Figure 5:
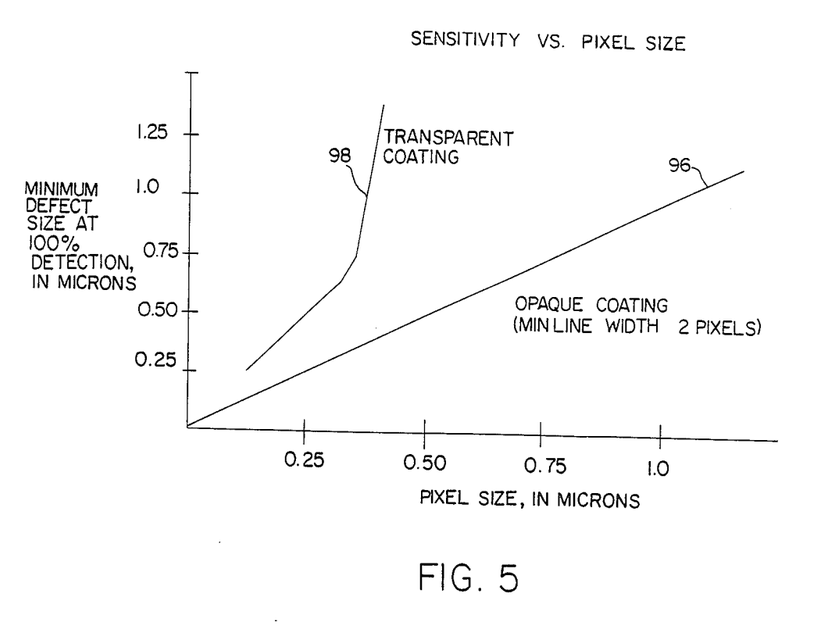
FIG. 5 shows a graph of the behavior of a typical inspection system when inspecting high contrast images such as chrome on glass or dyed resist, compared with an inspection of transparent resist on glass.

FIG. 5 shows the relationship in graph form of the pixel size of a typical transmitted light inspection system, of the type herein described, to its typical defect detection sensitivity when used to inspect different types of objects. The X-axis of the graph is the pixel size of the image analyzer, typically between 0.25 and 1.0 microns for present day automatic photomask and reticle inspection equipment. The Y-axis of the graph is the size of the smallest edge defect, as was shown at 86 and 88 in FIGS. 4C and 4E, respectively, for which the equipment achieves approximately 100% detection. Present day automatic inspection equipment for photomasks and reticles achieves approximately a 1:1 ratio of defect size to pixel size. This is possible largely because of the high contrast of the chrome-on-glass reticles and the thin chrome film which allows a high numerical aperture of the image analyzer without depth of focus problems. This ratio holds provided that the minimum line width is at least two pixels wide. Graph line 96 represents this situation when inspecting reticles and photomasks.

The situation is different when this type of inspection system is used to inspect resist coated substrates such as the monitor object 36 described previously. As shown earlier, the inspection system must use the dark band associated with the edges of the pattern and the pixel size must be small enough to properly sample it. If the pixel size becomes too large, then the dark band no longer provides a good signal and the system can no longer locate defects. This situation is represented by graph line 98 in FIG. 5. For present day automatic photomask and reticle inspection equipment, the numerical aperture of the image analyzer is typically 0.4 to 0.95 according to the minimum size of the line widths that are to be inspected, and the minimum size of the defects that are to be detected. When small linewidths are to be inspected, and small defects are to be detected, then a large numerical aperture is used. However, the large numerical aperture has a small depth of focus so typically only very thin films can be inspected. For the inspection of photoresist coated monitor substrates as mentioned previously, the photoresist must be no thinner than 0.5 microns in order to produce the necessary refractions and diffractions in order to produce the dark bands on the pattern edges; likewise the film thickness is typically no thicker than 1.5 microns to provide good pattern definition. In this case an inspection system numerical aperture of about 0.55 NA will provide the necessary depth of focus to keep the aforementioned photoresist in proper focus and will provide sufficient resolution to provide a good signal from the pattern edges which become about 0.35 microns in width. Thus, a pixel size of about 0.25 microns will properly sample the dark bands associated with the pattern edges.

Although the present invention has been described above in terms of a preferred embodiment specifically designed to perform in-situ qualification of reticles used in photolithographic patterning systems used in the manufacture of integrated circuits, it will be understood that the system or various parts thereof could be adapted for other applications. Accordingly, it is intended that the appended claims be interpreted as covering all such alterations, modifications or other applications as fall within the true scope of the invention.

What is claimed is:

1. A process for qualifying a reticle, master pattern, or the like, in-situ as it is used in a system for photolithographically creating an image on a substrate, such system normally including a source of illumination, a reticle or master pattern, and a substrate supporting means, comprising the steps of:

coating a transparent substrate with a layer of transparent photoresist material;

placing the coated substrate on the substrate supporting means;

using the source of illumination in combination with the reticle, or master pattern, to create an image of the reticle, or master pattern, on the substrate, thereby exposing the photoresist coated on the surface thereof;

removing the substrate from the supporting means;

developing the exposed photoresist to produce a transparent patterned mask on the surface of the substrate, said patterned mask corresponding to the pattern on the reticle, or master pattern, and in combination with the substrate, forming a monitor object;

inspecting the monitor object by passing light through both the transparent masked and transparent unmasked areas of the substrate to detect defects; and using the detected defects as a measure of the quality of the reticle or master pattern.

2. A process for qualifying a reticle, master pattern, or the like, as recited in claim 1 and further including the step of providing an opaque border around at least a substantial portion of the perimeter of the substrate before it is coated with the photoresist material, said border being used to facilitate automatic handling of the monitor object.

3. A process for qualifying a reticle, master pattern, or the like, as recited in claim 2 and further including the step of providing the substrate with a coating that is transmissive of predetermined wavelengths used for inspection purposes and is reflective of other predetermined wavelengths used for automatic handling and/or focussing of the monitor object.

4. A process for qualifying a reticle, master pattern, or the like, as recited in claim 2 and further including the step of providing the substrate with a coating that is transmissive of predetermined wavelengths used for inspection purposes and is absorptive of other predetermined wavelengths used for automatic handling and/or focussing of the monitor object.

5. A process for qualifying a reticle, master pattern, or the like, as recited in claim 2 wherein the substrate is transmissive of predetermined wavelengths used for inspection purposes and is absorptive of other predetermined wavelengths used for automatic handling and/or focussing of the monitor object.

6. A process for qualifying a reticle, master pattern, or the like, as recited in claim 1 and further including the step of providing the substrate with a coating that is transmissive of predetermined wavelengths used for inspection purposes and is reflective of other predetermined wavelengths used for automatic handling and/or focussing of the monitor object.

7. A process for qualifying a reticle, master pattern, or the like as recited in claim 6 wherein the substrate is transmissive of predetermined wavelengths used for inspection purposes and is absorptive of other predetermined wavelengths used for automatic handling and/or focussing of the monitor object.

8. A process for qualifying a reticle, master pattern, or the like as recited in claim 1 wherein the substrate is transmissive of predetermined wavelengths used for inspection purposes and is absorptive of other predetermined wavelengths used for automatic handling and/or focussing of the monitor object.

9. A process for qualifying a reticle, master pattern, or the like, as recited in claim 8 and further including the step of providing the substrate with a coating that is transmissive of predetermined wavelengths used for inspection purposes and is reflective of other predetermined wavelengths used for automatic handling and/or focussing of the monitor object.

10. A process for qualifying a reticle, master pattern, or the like, as recited in claim 9 and further including the step of providing an opaque border around at least a substantial portion of the perimeter of the substrate before it is coated with the photoresist material, said border being used to facilitate automatic handling of the monitor object.

11. A process for qualifying a reticle, master pattern, or the like, as recited in claim 1 wherein the transparent substrate is made of a material selected from the group of materials including glass, quartz, sapphire and borosilicate.

12. A process for qualifying a reticle, master pattern, or the like, as recited in claim 1 wherein the substrate is transparent to predetermined wavelengths of light used to inspect the monitor object and is opaque to other predetermined wavelengths of light.

13. A process for qualifying a reticle, master pattern, or the like, as recited in claim 12 wherein the photoresist material is transparent to predetermined wavelengths of light used to inspect the monitor object and is opaque to other predetermined wavelengths of light.

14. A process for qualifying a reticle, master pattern, or the like, as recited in claim 1 wherein the photoresist material is transparent to predetermind wavelengths of light used to inspect the monitor object and is opaque to other predetermined wavelengths of light.

15. A process for qualifying a reticle, master pattern, or the like, as recited in claim 1 wherein during inspection of the monitor object light is passed through the masked and unmasked areas of the substrate in a manner so as to create an image having bands signifying the edges of the masked areas.

16. A process for qualifying a reticle, master pattern, or the like, as recited in claim 15 wherein the bands created by the monitor object are compared to corresponding dark bands of a reference.

17. A process for qualifying a reticle, master pattern, or the like, as recited in claim 15 wherein said bands are created using darkfield illumination of the monitor object.

18. A process for qualifying a reticle, master pattern, or the like, as recited in claim 15 wherein said bands are created using brightfield illumination of the monitor object.

19. A process for qualifying a reticle, master pattern, or the like, as recited in claim 15 wherein the inspection is made using a sampling system having a pixel size approximately equal to or smaller than the width of a band.

20. A process for qualifying a reticle, master pattern, or the like, as recited in claim 1 wherein an optical system having a predetermined numerical aperture is used to pass light through the monitor object during inspection thereof.

21. A process for qualifying a reticle, master pattern, or the like, as recited in claim 20 wherein said predetermined numerical aperture is large enough to provide an image having a high contrast band and small enough that the optical system has sufficient depth of field to accommodate the thickness of the patterned mask.

22. A process for qualifying a reticle, master pattern, or the like, as recited in claim 21 wherein the inspection is made using a sampling system having a pixel size approximately equal to or smaller than the width of a band.

23. A monitor object for use in qualifying a particular recticle, master pattern, or the like, in-situ as it is used in a system for photolithographically creating an image on a product object, comprising:
a substrate which is transparent to predetermined visible wavelenths of light and has physical dimensions generally corresponding to those of said particular product object to be qualified using said monitor object; and
a coating of transparent photoresist material covering at least one surface of substrate, said coating being used to produce a transparent patterned mask on the surface of said substrate when photolithographically exposed to illumination passed through the reticle or master pattern, whereby light may be passed through the transparent masked and transparent unmasked areas of the sustrate to create an image which may be compared to a reference to detect defects in said reticle or master pattern.

24. A monitor object as recited in claim 23 and further comprising means forming an opaque substrate border around at least a portion of the perimeter of said substrate for facilitating the automatic handling of the monitor object.

25. A monitor object as recited in claim 24 and further comprising a coating on said substrate that is transmisssive of predetermined wavelengths used for inspection purposes and is reflective of other predetermined wavelengths used for automatic handling and/or focussing of the monitor object.

26. A monitor object as recited in claim 24 and further comprising a coating on said substrate that is transmissive of predetermined wavelengths used for inspection purposes and is absorptive of other predetermined wavelengths used for automatic handling and/or focussing of the monitoring object.

27. A monitor object as recited in claim 24 wherein the substrate is transmissive of predetermined wavelengths used for inspection purposes and is absorptive of other predetermined wavelengths used for automatic handling and or focussing of the monitor object.

28. A monitor object as recited in claim 23 and further comprising a coating that is transmissive of predetermined wavelengths used for inspection purposes and is reflective of other predetermined wavelengths used for automatic handling and/or focussing of the monitor object.

29. A monitor object as recited in claim 28 wherein the substrate is transmissive of predetermined wavelengths used for inspection purposes and is absorptive of other predetermined wavelengths used for automatic handling and/or focussing of the monitor object.

30. A monitor object as recited in claim 23 wherein the substrate is transmissive of predetermined wavelengths used for inspection purposes and is absorptive of other predetermined wavelengths used for automatic handling and/or focussing of the monitor object.

31. A monitor object as recited in claim 30 and further comprising a coating that is transmissive of predetermined wavelengths used for inspection purposes and is reflective of other predetermined wavelengths used for automatic handling and/or focussing of the monitor object.

32. A monitor object as recited in claim 31 and further comprising means forming an opaque border around at least a portion of the perimeter of the substrate, said border being used to facilitate automatic handling of the monitor object.

33. A monitor object as recited in claim 23 wherein the transparent substrate is made of a material selected from the group of materials including glass, quartz, sapphire and borosilicate.

34. A monitor object as recited in claim 23 wherein the substrate is transparent to wavelengths of light used to inspect the monitor object.

35. A monitor object as recited in claim 34 wherein the photoresist material is transparent to wavelengths of light used to inspect the monitor object.

36. A monitor object as recited in claim 23 wherein the photoresist material is transparent to wavelengths of light used to inspect the monitor object.

37. A process for inspecting an object consisting of a transparent substrate, having formed thereon regions of transparent material, for the purpose of determining that the boundaries of the regions are accurately defined, comprising the steps of:
  passing light through the object to form an image thereof wherein the boundaries of the regions appear as bands; and
  comparing the bands to a reference to locate variances exceeding predetermined criteria.

38. A process for inspecting an object as recited in claim 37 wherein the step of passing light through the object is accomplished by
  illuminating the object with a beam of light having a predetermined angle of convergence;
  collecting the light passing through the object and focussing it upon a detector to detect the level of light transmission of the object on a pixel by pixel basis.

39. A process for inspecting an object as recited in claim 37 wherein the step of comparing the bands to a reference includes the steps of identifying each pixel falling within the bands and comparing the level of light transmitted therethrough to a reference.

40. A process for inspecting an object as recited in claim 37 wherein the step of passing light through the object is accomplished using an image forming system having a numerical aperture large enough to provide an image having high contrast bands and small enough that the optical system has sufficient depth of field to accommodate the thickness of the transparent material.

41. A process for inspecting an object as recited in claim 40 wherein the detected level of light of each pixel is obtained using a sampling system having a pixel size approximately equal to or smaller than the width of a band.

42. A process for inspecting an object consisting of a transparent substrate, having formed thereon regions of transparent material, for the purpose of determining that the boundaries of the regions are accurately defined, comprising the steps of:
  passing light through the object to form an image thereof wherein the boundaries of the regions appear as bands; and
  comparing the bands to a reference to determine the accuracy of their definition.

43. A process for inspecting an object as recited in claim 42 wherein the step of passing light through the object is accomplished by
  illuminating the object with a beam of light having a predetermined angle of convergence;
  collecting the light passing through the object and focussing it upon a detector to detect the level of light transmission of the object on a pixel by pixel basis.

44. A process for inspecting an object as recited in claim 42 wherein the step of comparing the bands to a reference includes the steps of identifying each pixel falling within the bands and comparing the level of light transmitted therethrough to a reference.

45. A process for inspecting an object as recited in claim 42 wherein the step of passing light through the object is accomplished using an image forming system having a numerical aperture large enough to provide an image having high contrast bands and small enough that the optical system has sufficient depth of field to accommodate the thickness of the transparent material.

46. A process for inspecting an object as recited in claim 45 wherein the detected level of light of each pixel is obtained using a sampling system having a pixel size approximately equal to or smaller than the width of a band.

47. A process for inspecting an object consisting of a transparent substrate, having formed thereon regions of transparent material, for the purpose of determining that the boundaries of the regions are accurately defined, comprising the steps of:
  passing light through the object to form an image thereof wherein the boundaries of the regions appear as bands; and
  inspecting the image to determine whether or not a particular characteristic of the bands is consistent with a predetermined criteria.

48. A process for inspecting an object as recited in claim 47 wherein the step of passing light through the object is accomplished by illuminating the object with a beam of light having a predetermined angle of convergence;
  collecting the light passing through the object and focussing it upon a detector to detect the level of light transmission of the object on a pixel by pixel basis.

49. A process for inspecting an object as recited in claim 47 wherein the step of comparing the bands to a reference includes the steps of identifying each pixel falling within the bands and comparing the level of light transmitted therethrough to a reference.

50. A process for inspecting an object as recited in claim 47 wherein the step of passing light through the object is accomplished using an image forming system having a numerical aperture large enough to provide an image having high contrast bands and small enough that the optical system has sufficient depth of field to accommodate the thickness of the transparent material.

51. A process for inspecting an object as recited in claim 50 wherein the detected level of light of each pixel is obtained using a sampling system having a pixel size approximately equal to or smaller than the width of a band.

* * * * *